US008653892B2

(12) United States Patent
Wang et al.

(10) Patent No.: US 8,653,892 B2
(45) Date of Patent: Feb. 18, 2014

(54) SYSTEMATIC INTERMODULATION DISTORTION CALIBRATION FOR A DIFFERENTIAL LNA

(76) Inventors: Cheng-Han Wang, San Jose, CA (US);
Liang Zhao, Sunnyvale, CA (US); Hong Sun Kim, San Jose, CA (US); I-Hsiang Lin, Los Altos, CA (US)

( * ) Notice: Subject to any disclaimer, the term of this patent is extended or adjusted under 35 U.S.C. 154(b) by 77 days.

(21) Appl. No.: 13/167,655

(22) Filed: Jun. 23, 2011

(65) Prior Publication Data

US 2012/0326792 A1 Dec. 27, 2012

(51) Int. Cl.
*H03F 1/26* (2006.01)

(52) U.S. Cl.
USPC .............................. 330/149; 330/253; 330/261

(58) Field of Classification Search
USPC ................................... 330/149, 285, 253, 261
See application file for complete search history.

(56) References Cited

U.S. PATENT DOCUMENTS

| 6,208,849 B1 * | 3/2001 | Cho et al. ....................... 455/296 |
| 6,531,924 B2 | 3/2003 | Aparin |
| 7,554,380 B2 | 6/2009 | Embabi et al. |
| 8,050,649 B2 * | 11/2011 | Chen et al. ..................... 455/326 |
| 2005/0143044 A1 | 6/2005 | Kim |
| 2005/0157290 A1 | 7/2005 | Lee et al. |
| 2006/0234664 A1 | 10/2006 | Chiu et al. |
| 2009/0075622 A1 | 3/2009 | Zhuo et al. |
| 2009/0154377 A1 | 6/2009 | Tsuda et al. |
| 2010/0093298 A1 | 4/2010 | Pratt et al. |
| 2010/0194449 A1 | 8/2010 | Arnborg |
| 2011/0128992 A1 | 6/2011 | Maeda et al. |
| 2012/0077453 A1* | 3/2012 | Ahrari et al. .................. 455/341 |

OTHER PUBLICATIONS

International Search Report and Written Opinion—PCT/US2012/043918—ISA/EPO—Nov. 28, 2012.
Kivekaskivekas K., et al., "Calibration Techniques of Active BiCMOS Mixers", IEEE Journal of Solid-State Circuits, IEEE Service Center, Piscataway, NJ, USA, vol. 37, No. 6, Jun. 1, 2002, XP011065777, ISSN: 0018-9200 the whole document.

* cited by examiner

*Primary Examiner* — Khanh V Nguyen
(74) *Attorney, Agent, or Firm* — Ramin Mobarhan

(57) ABSTRACT

Systematic IM2 calibration for a differential LNA is disclosed. In an aspect, an apparatus includes an amplifier configured to output an amplified signal having a level of systematic pre-mixer IM2 distortion, a detector configured to detect the level of the systematic pre-mixer IM2 distortion in the amplified signal, and a bias signal generator configured to generate at least one bias signal configured to adjust the amplifier to reduce the level of the systematic pre-mixer IM2 distortion.

20 Claims, 7 Drawing Sheets

SYSTEMATIC INTERMODULATION DISTORTION CALIBRATION FOR A DIFFERENTIAL LNA

BACKGROUND

1. Field

The present application relates generally to the operation and design of transceivers, and more particularly, to intermodulation (IM) distortion reduction.

2. Background

High quality signal reception is especially important for the current generation of portable devices. Typically, such devices provide multiple services, such as wireless communication services and, for example, position location services that requires the reception of global positioning system (GPS) signals. Thus, the front end of a device's receiver needs to be carefully designed to reject interfering signals, referred to as jammers or jamming signals, and receive desired signals with high quality.

To illustrate the problem, consider a GPS coexistence scenario where a portable device includes a GPS receiver and a cellular transmitter. In this GPS coexistence scenario, strong radio frequency second order intermodulation (IM2) distortions can be generated from signals at the front end of the GPS receiver due to transmissions on the cellular channel. For example, the GPS L1 band is at approximately 1575.42 MHz and a $2^{nd}$ order intermodulation harmonic associated with B13 (Uplink: 777-787 MHz) of an LTE (Long Term Evolution) communication system will fall into this GPS L1 band. It would therefore be desirable to address such IM2 distortions to enhance GPS system performance.

Many of the existing solutions attempt to reduce IM2 distortions generated during and/or after frequency down-conversion (post-mixer). These distortions can be referred to as baseband IM2 (BB-IM2). Unfortunately, in numerous scenarios IM2 distortion is generated prior to the down-conversion stages (pre-mixer), such as in WiFi 802.11b/g/n and GSM850 Band Coexistence (2400 MHz-825 MHz), or the $2^{nd}$ harmonic of B13 (Uplink: 777-787 MHz) LTE. Thus, for example, the common mode portion of a jamming signal may intermodulate with its own differential portion, which may generate systematic pre-mixer IM2 at the differential input of an LNA in the receiver's front end. Such IM2 distortion may not be canceled out by conventional calibration schemes designed to reduce BB-IM2. Other techniques utilized to reduce pre-mixer IM2 include additional filtering at the front end which may help, but also increases the number of required circuit components and can add additional noise to the system.

Therefore, it would be desirable to have an efficient and cost effective way to reduce or eliminate systematic pre-mixer IM2 distortion in a receiver front end.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
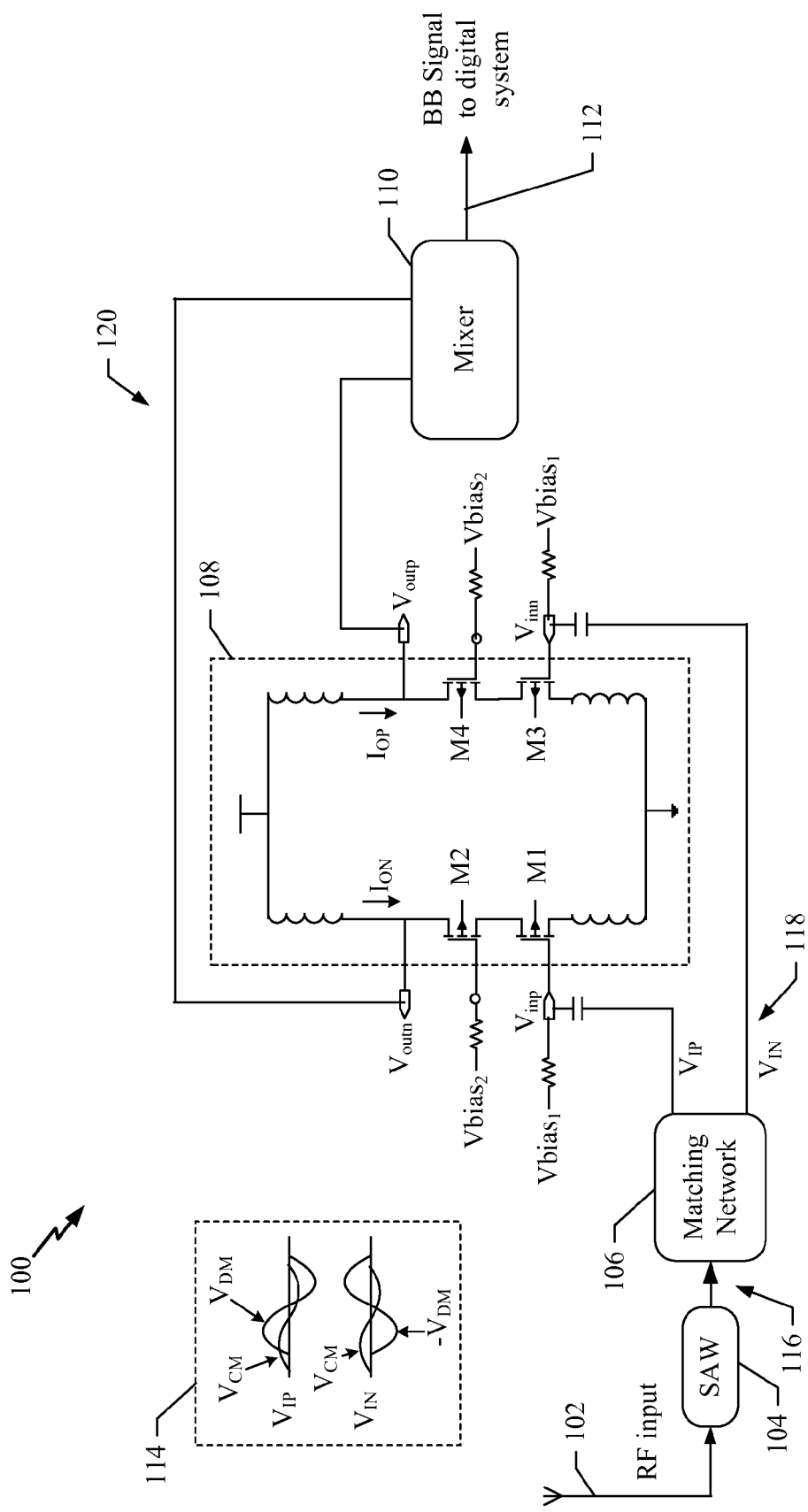
FIG. 1 shows a conventional front end that illustrates how systematic IM2 distortion can be generated.

FIG. 1 shows a conventional front end 100 that illustrates how systematic IM2 distortion can be generated. For example, the front end 100 is suitable for use in a transceiver front end of a wireless device.

The front end 100 comprises a surface acoustic wave (SAW) filter 104 that operates to filter an RF input signal received from antenna 102. The output of the SAW filter 104 is a filtered RF signal 116 that is coupled to a matching network 106 that operates to provide impedance matching to output differential filtered RF signals 118 that are input to LNA 108. The LNA 108 amplifies the filtered RF signals and provides differential output signals 120 to a mixer 110. The mixer 110 down converts the differential output signals 120 to a baseband (BB) signal 112 for further processing by a digital system.

During operation, the input signals to the LNA 108 comprise common-mode ($V_{CM}$) and differential mode ($V_{CM}$) components as illustrated at signal diagram 114. For example, the input signal $V_{IP}$ comprises the components $V_{CM}$ and $V_{DM}$ and the input signal $V_{IN}$ comprises the components $V_{CM}$ and $-V_{DM}$. As shown discussed, the amplified signals output from the LNA 108 may comprise systematic IM2 distortion that occurs prior to the operation of the mixer 110. It is desirable to reduce or minimize such systematic pre-mixer IM2 distortion.

Theory of Operation

Typically, for a differential system, it is commonly understood that any even-order distortion terms would be rejected given a perfectly balanced system. However, as shown below, this may not be true when there is a coexistence of common-mode and differential-mode input signals.

The LNA 108 comprises differential NMOS transistor pair (M1 and M3) that receives differential input voltage signals ($V_{IP}$ and $V_{IM}$) to produce differential output currents ($I_{OP}$ and $I_{OM}$). The differential input voltage signals comprise a common mode voltage signal $V_{CM}$ and a differential mode voltage signal $V_{DM}$ as shown above. The following definitions and circuit parameters are used to describe the operation of the LNA 108.

1. $I_O = I_{OP} - I_{OM}$
2. $V_I = V_{IP} - V_{IM}$
3. $V_{th}$ is the transistor threshold voltage
4. $V_G$ is the transistor gate dc bias voltage Given the above definitions and parameters, the following expressions describe operation of the LNA 108.

$$I_{OP} = \frac{K}{2}(Vip + Vg - Vth)^2 \quad (1)$$

$$I_{OM} = \frac{K}{2}(Vim + Vg - Vth)^2 \quad (2)$$

$$I_O = I_{OP} - I_{OM} = \frac{K}{2}(Vip - Vim)(Vip + Vim + 2Vg - 2Vth) \quad (3)$$

$$I_O = \frac{K}{2}Vdm(2Vcm + 2Vg - 2Vth) \quad (4)$$

$$I_O = KVdm(Vg - Vth) + KVdmVcm \quad (5)$$

Based on the above expressions, the 1$^{st}$ order differential output term is represented by:

$$KVdm(Vg-Vth) \quad (6)$$

The IM2 distortion term is represented by:

$$KVdmVcm \quad (7)$$

The IM2 rejection is represented by:

$$\frac{Vcm}{2(Vg - Vth)} \quad (8)$$

As shown from above, a differential system could generate a systematic even order term when both common-mode and differential-mode signals are present, and therefore one could simplify the differential system with a single-ended non-linear system with systematic even-order distortions. In various implementations, the calibration system operates to manipulate the 1$^{st}$ order non-linearity of the LNA output impedance to reduce, minimize or cancel out the 2$^{nd}$ order non-linearity accumulated at the LNA output.

Figure 2:
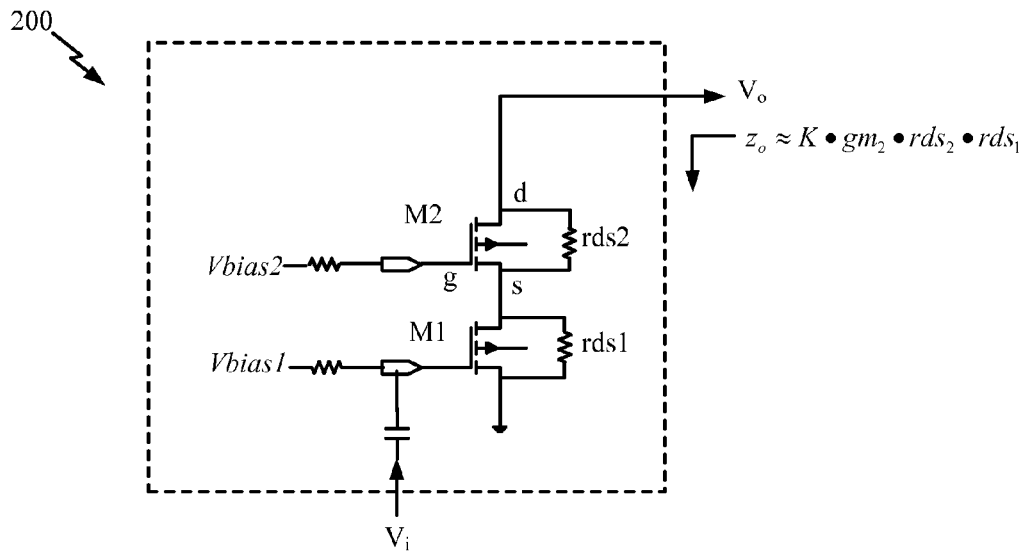
FIG. 2 shows an exemplary amplifier that illustrates how input bias signals levels can be set to control amplifier output impedance.

FIG. 2 shows an exemplary amplifier 200 that illustrates how input bias signals levels can be set to control an amplifier output impedance. For example, the amplifier 200 may be part of an LNA.

In deep sub-micron CMOS technology, when a MOS transistor is in its saturation region and it is current mirrored (meaning $V_{gs}$ is fixed); its drain-source impedance $r_{ds}$ will change due to changes in $V_{ds}$ and $V_{gd}$. It is then possible to take advantage of these characteristics to control the impedance parameter $Z_O$.

The amplifier 200 has a cascode configuration so that the output small signal 1$^{st}$ order impedance ($Z_O$) can be represented as follows.

$$Z_O \approx K_O * gm_2 * rds_2 * rds_1 \quad (9)$$

where $gm_2$ is the transconductance of M2, $rds_2$ and $rds_1$ are the drain-source impedances of M2 and M1, respectively, and $K_O$ is a constant.

Thus, the impedance $Z_O$ can be changed by changing any of the parameters ($gm_2$, $rds_2$, or $rds_1$). In an exemplary implementation, the bias signals Vbias1 and Vbias2 are set to adjust the parameters rds1 and rds2 so as to set the impedance $Z_O$ as illustrated in the graph below.

Figure 3:
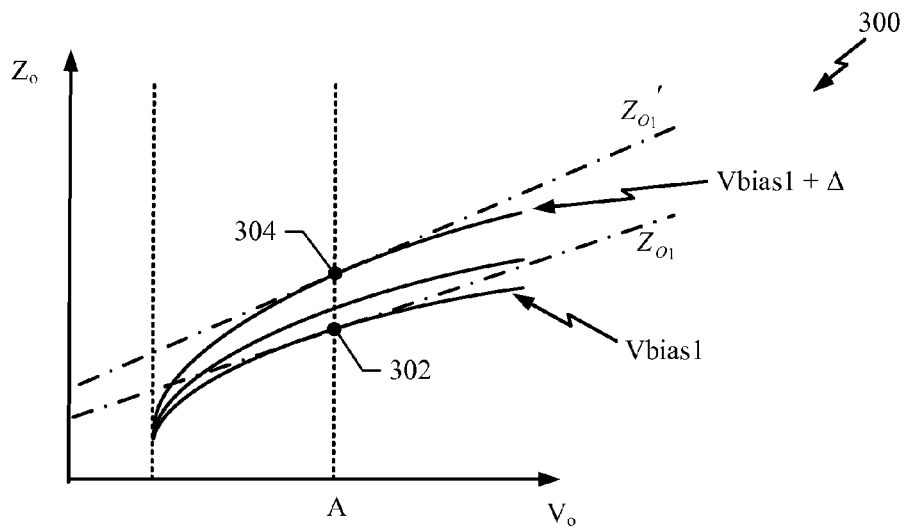
FIG. 3 shows an exemplary graph that illustrates the relationship between the input bias voltage levels and the impedance of the amplifier shown in FIG. 2.

FIG. 3 shows an exemplary graph 300 that illustrates the relationship between the input bias voltage levels and the output impedance of the amplifier 200 shown in FIG. 2. For clarity the graph 300 illustrates the relationship between the bias voltage Vbias1 and the output impedance $Z_O$, however, a similar graph can be generated for the bias signal Vbias2. Thus, one or both of Vbias1 and Vbias2 can be set to obtain a desired output impedance level.

As illustrated in the graph 300, for a particular operating point (A) the output impedance $Z_O$ changes based on the level of the bias signal Vbias1. Also shown in the graph 300 are dashed lines representing the slopes or first derivatives ($Z_{01}$ and $Z_{01}'$) associated with two bias levels. These dashed lines represent the rate of change of the output impedance with respect to the output voltage at particular bias levels. For example, the impedance $Z_O$ can be determined from the following expression.

$$Zo(Vo) = Zo_0 + Zo_1(Vo) + Zo_2(Vo)^2 + \quad (10)$$

The value $Z_{O1}$ is the derivative of $Z_O$ with respect to the output voltage and can be determined from the following expression.

$$\left.\frac{\partial Zo}{\partial Vo}\right|_{Vo=A} = Z_{o1|Vo=A} \quad (11)$$

As the level of the bias signal is changed to adjust the output impedance $Z_O$ at the operating point A, the slope $Z_{O1}$ also changes. For example, the slope $Z_{01}$ at point 302 is less than the slope $Z_{01}'$ at point 304.

Thus, adjusting either the LNA cascode bias voltage (Vbias2) or the differential pair gate bias voltage (Vbias1) will vary the 1$^{st}$ order non-linearity term of the LNA output impedance until an optimized point is reached. As described further below, the optimized point occurs where systematic IM2 distortion is reduced or minimized. This optimized point is a function of the LNA's DC transconductance and the ratio of differential/common-mode jammer level. Since the differential/common-mode jammer ratio stays constant once a certain type of SAW filter is determined, an issue of concern becomes the LNA's GM change due to process variation.

Figure 4:
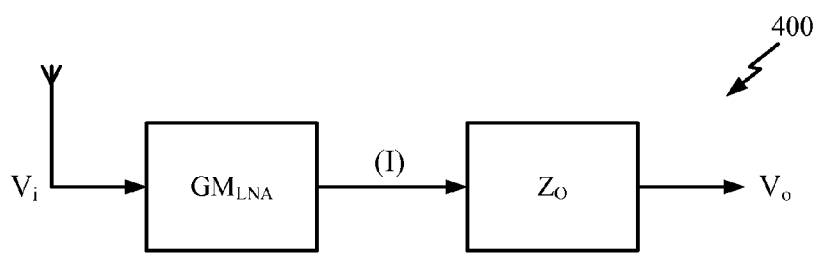
FIG. 4 shows a block diagram of an exemplary LNA that illustrates how the output impedance can be set to reduce systematic pre-mixer IM2 distortion.

FIG. 4 shows a block diagram of an exemplary LNA 400 that illustrates how the output impedance can be set to reduce systematic pre-mixer IM2 distortion. The diagram 400 comprises transconductance ($GM_{LNA}$) associated with an LNA that converts an input voltage $V_1$ to a current (I). Output impedance ($Z_O$) converts the current I into an output voltage $V_O$. The following expressions are associated with the diagram 400.

$$RF_{SIG} = V_1 \quad (12)$$

$$GM_{LNA}(V_1) = GM_1(V_1) + GM_2(V_1)^2 - |GM_3|(V_1)^3 \quad (13)$$

$$Z_O(V_1) = Z_{O_0} - |Z_{O_1}|(V_1) + Z_{O_2}(V_1)^2 + \quad (14)$$

$$V_O = V_1 * GM_{LNA} * Z_O(V_1) \quad (15)$$

$$V_O = GM_1 Z_{O_0} - GM_1|Z_{O_1}|(V_1)^2 + GM_2 Z_{O_0}(V_1)^2 + GM_1 Z_{O_2}(V_1)^3 - GM_2|Z_{O_1}|(V_1)^3 - |GM_3|Z_{O_0}(V_1)^3 \quad (16)$$

The above expression for $V_O$ shows the fundamental and non-linear terms up to the $3^{rd}$ order harmonics. Ignoring the $3^{rd}$ order non-linearity term, the fundamental term is as follows where $Z_{O0}$ represents a constant.

$$GM_1 Z_{O_0} \quad (17)$$

The second order intermodulation term is as follows.

$$-GM_1|Z_{O_1}|(Vi)^2 + GM_2 Z_{O_0}(Vi)^2 \quad (18)$$

As can be seen from the above equation (18) representing the systematic pre-mixer IM2 distortion, if $GM_1$, $GM_2$, $Z_{o1}$, $Z_{o0}$ have the same polarity, then the impedance parameter ($Z_{O_1}$) can be set by adjusting VBias1 and/or VBias2 so that the IM2 distortion is canceled out, reduced, or minimized as follows.

$$(-GM_1|Z_{O_1}| + GM_2 Z_{O_0}) = 0 \quad (19)$$

Accordingly, an exemplary calibration method is disclosed herein that is nearly independent of the absolute jammer level, but is dependent on the ratio between the common-mode and the differential mode jammer level. This means that it is possible to apply one calibration setting that works for virtually all power levels, and the calibration result is not a function of the relative CM/DM phase difference. With a properly chosen bias circuit design, the result will track with temperature well. This limits the scope of the problem to the process of calibration, which means that the calibration can be performed at powered up or at any other desired time and the result will stay valid after that.

Figure 5:
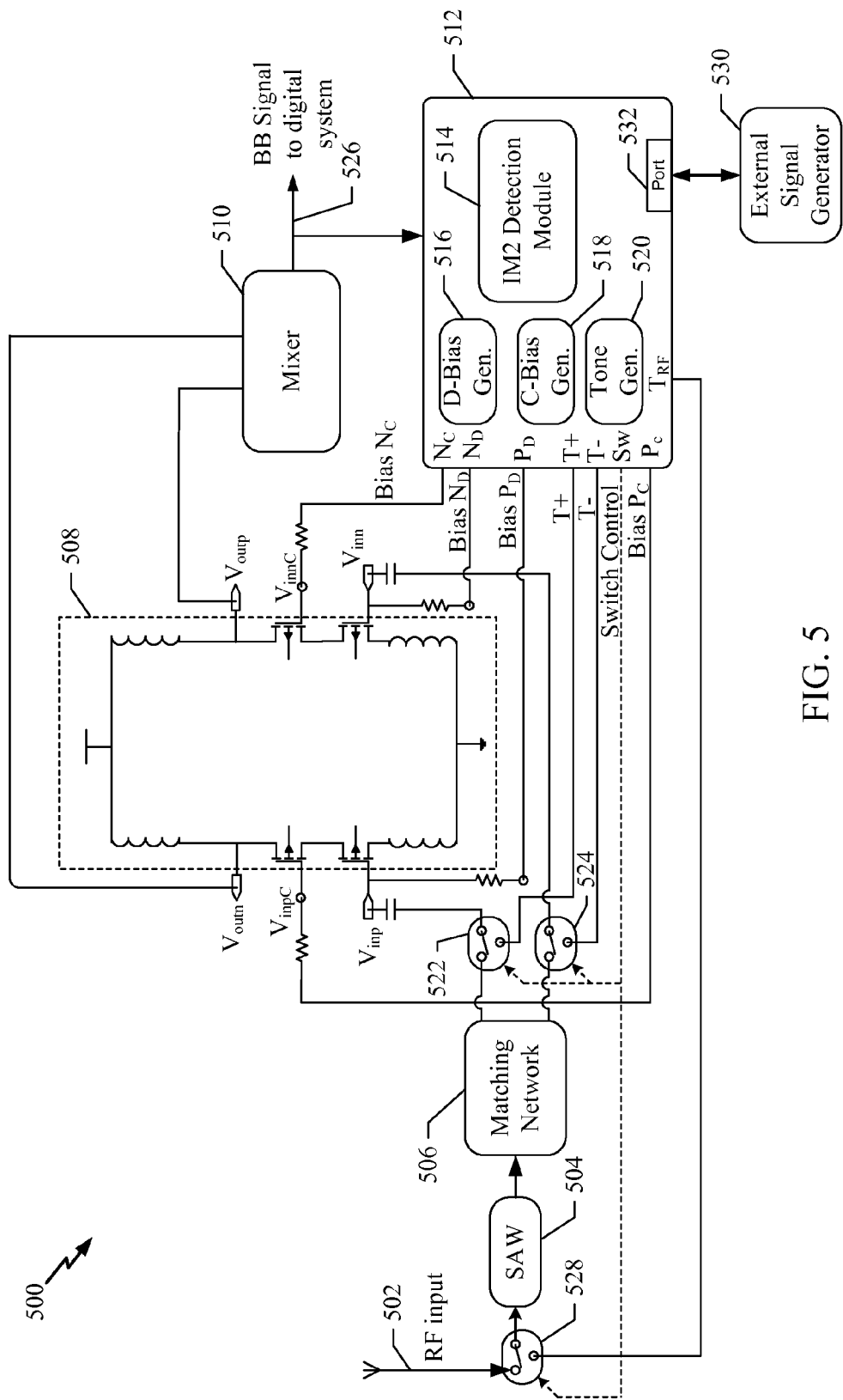
FIG. 5 shows a diagram of an exemplary calibration system configured to reduce systematic pre-mixer IM2 distortion associated with an LNA.

FIG. 5 shows a diagram of an exemplary calibration system 500 configured to reduce systematic pre-mixer IM2 distortion associated with an LNA. For example, the system 500 is suitable for use in a transceiver front end of a wireless device.

The system 500 comprises a SAW filter 504 that operates to filter an RF input signal received from antenna 502. The output of the SAW filter 504 is a filtered RF signal that is coupled to a matching network 506 that operates to provide impedance matching to allow the filtered RF signal to be input to LNA 508. The LNA 508 amplifies the filtered RF signal and provides differential amplified signals ($V_{outp}$, $V_{outn}$) to a mixer 510. The amplified signals may include systematic pre-mixer IM2 distortion. The mixer 510 down converts the differential amplified signals to a baseband (BB) signal 526 for further processing by a digital system.

The system 500 also comprises calibration module 512. The calibration module 512 receives the BB signal 526 and generates bias signals that operate to reduce systematic pre-mixer IM2 distortions that appear in the BB signal.

The calibration module 512 comprises IM2 detection module 514 that operates to detect IM2 distortions in the BB signal 526. The detection module 514 also operates to control other functions of the calibration module 512 to perform IM2 detection and calibration. The calibration module 512 also comprises a tone generator 520 that operates to generate one or more tones that can be injected into the input of the LNA 108. The tone generator 520 also operates to generate an RF tone signal ($T_{RF}$) that is input to the SAW filter 504 using switch 528. The calibration system further comprises bias generators 516 and 518 that operate to generate differential (D-Bias) and cascode bias (C-Bias) signals (Bias $P_D$, Bias $N_D$, Bias $P_C$, and Bias $N_C$) that are input to the LNA to reduce systematic pre-mixer IM2 distortion. The calibration module 512 also comprises input port 532 that is configured to receive externally generated signals from an external signal generator 530. The operation and functions of the module 512 are further explained with greater detail in conjunction with FIG. 7 and FIG. 9.

During a first calibration mode, the module 512 outputs a switch control signal to switches 522 and 524. The switch control signal operates to control the switches 522 and 524 to connect the T+ and T− outputs of the module 512 to the LNA inputs Vinp and Vinn so that tones generated by the tone generator 520 can be input to the LNA differential inputs Vinp and Vinn. When the switches 522 and 524 connect the T+ and T− outputs to the LNA inputs, they also disconnect the outputs of the matching network 506 from the LNA inputs.

The LNA 508 operates to amplify the tones (T+ and T−) at its differential inputs and produce differential amplified signals Voutp and Voutn that are routed to the mixer 510. The mixer 510 down converts the amplifier signals to produce the BB signal 526 that is input to the module 512. Any systematic pre-mixer IM2 distortion due to the operation of the LNA 508 will appear in the BB signal.

The IM2 detection module 514 operates to detect any systematic pre-mixer IM2 distortions in the BB signal 526 and controls one or both of the bias generators 516 and 518 to adjust the level of their respective bias signals until the systematic pre-mixer IM2 distortion in the BB signal 526 is reduced.

In one exemplary operation, cascode bias signals Pc and Nc are maintained at ground while the differential pair bias signals Pd and Nd are adjusted to reduce the systematic pre-mixer IM2 distortion. In another exemplary implementation, the differential pair bias signals Pd and Nd are maintained at ground while the cascode bias signals Pc and Nc are adjusted to reduce the systematic pre-mixer IM2 distortion. In still another exemplary implementation, both of the differential and cascode bias signals are adjusted to reduce the systematic pre-mixer IM2 distortion.

Once the desired level for the differential and cascode bias signals is determined, those levels are maintained and the module 512 outputs the switch control signal to couple the output of the matching network 506 to the LNA inputs Vinp and Vinn. The LNA 508 will now operate with reduced systematic pre-mixer IM2 distortion.

During a second calibration mode, the module 512 outputs a switch control signal to switch 528. The switch control signal operates to control the switch 528 to connect the $T_{RF}$ output of the module 512 to the input of the SAW filter 504 so that a tone generated by the tone generator 520 can be input to the SAW filter 505.

To reduce systematic pre-mixer IM2 distortions, the module 512 performs the same operations as in the first calibration mode. Thus, in one exemplary operation, the cascode bias signals Pc and Nc are maintained at ground while the differential pair bias signals Pd and Nd are adjusted to reduce the systematic pre-mixer IM2 distortion. In another exemplary implementation, the differential pair bias signals Pd and Nd are maintained at ground while the cascode bias signals Pc and Nc are adjusted to reduce the systematic pre-mixer IM2 distortion. In still another exemplary implementation, both of the differential and cascode bias signals are adjusted to reduce the systematic pre-mixer IM2 distortion. This second mode of operation reduces systematic pre-mixer IM2 distortion generated by the operation of the SAW filter 504 and/or the matching network 506 in addition to the LNA 108.

Once the appropriate bias signal levels are determined, data relating to the levels are stored in a memory at the module 512 for later use. For example, the data may be used to reload the levels at power up.

In another exemplary implementation, the external signal generator 530 generates highly linear tones that are input to the module 512 using the port 532. In an implementation where the tone generator 520 does not generate tones that are linear or of lower quality, the external signal generator 530 can be used in the various calibration methods described.

In another exemplary implementation, the bias generators 516 and 518 are temperature and process compensated bias generators. For example, each temperature and process compensated bias generator is configured to output a precise temperature and/or process compensated bias voltage. In one implementation, the bias voltage generators 516 and 518 output precise temperature and/or process compensated bias voltages whose levels are determined using the calibration module 512 and any of the calibration methods described herein.

During an operational mode, the switches 522, 524, and 528 are set to couple an RF input signal to the SAW filter 504 and thereafter to the LNA inputs. The bias voltage generators 516 and 518 are set to output precise bias voltages to reduce systematic pre-mixer IM2 distortion.

Therefore, the system 500 is configured to provide calibration methods to determine the level of the differential and cascode bias signals to reduce systematic pre-mixer IM2 distortion associated with an LNA. The calibration can be performed during manufacture, initial activation, at power up, or periodically during device operation. An operational mode is provided wherein the LNA is configured for normal operation and to utilize the appropriate bias levels determined from the calibration methods to reduce systematic pre-mixer IM2 distortion. It should be noted that the aspects shown in FIG. 5 are exemplary and not intended to be limiting or restrictive, and therefore a variety of other implementations and aspects are possible.

Figure 6:
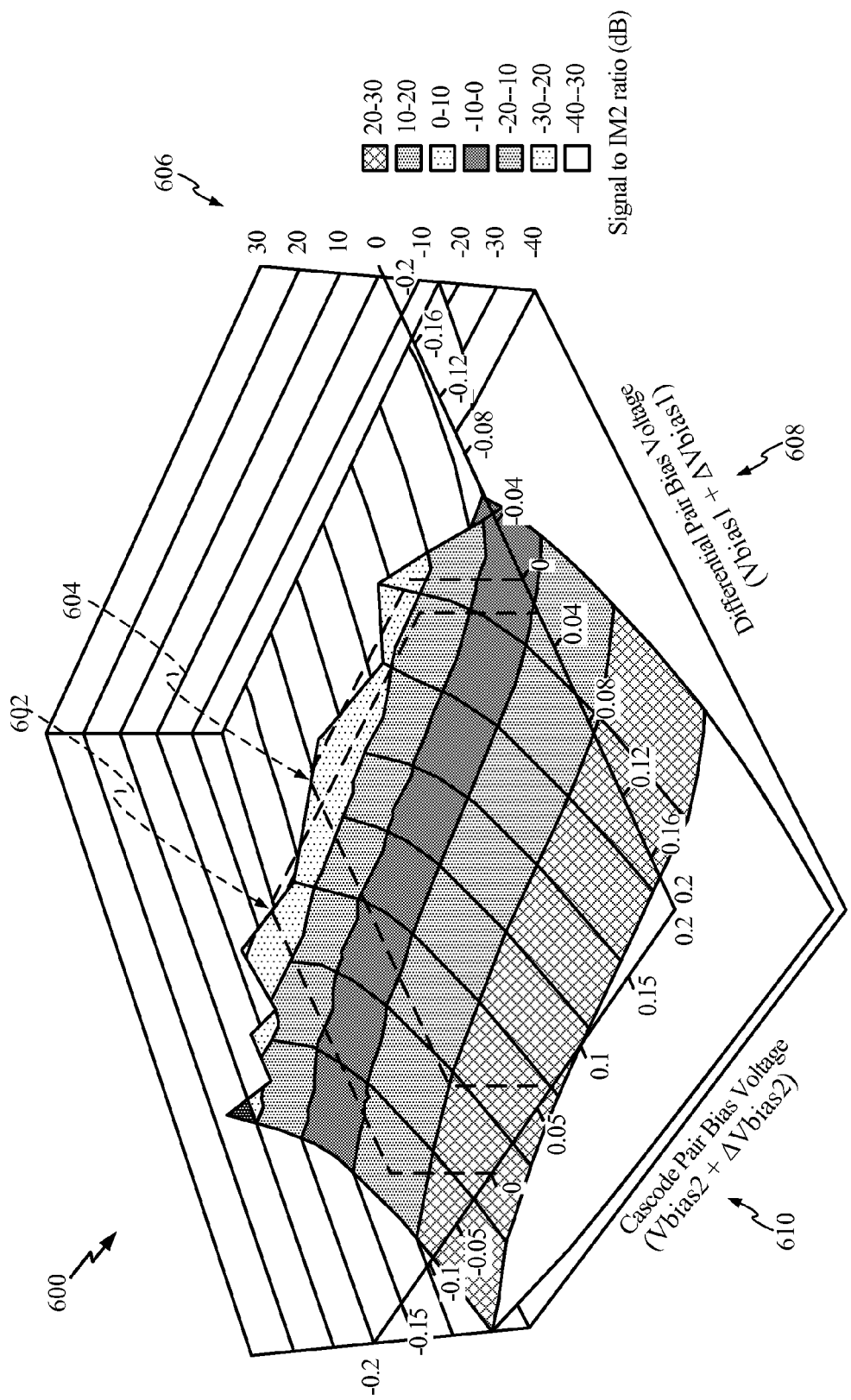
FIG. 6 shows an exemplary three dimensional plot illustrating differential and cascode bias voltages to reduce systematic pre-mixer IM2 distortion associated with an LNA.

FIG. 6 shows an exemplary three dimensional plot 600 illustrating the selection of differential and cascode bias voltage levels to reduce systematic pre-mixer IM2 distortion associated with an LNA. For example, the plot 600 shows differential and cascode bias voltage levels that are used to adjust the LNA output impedance such that systematic pre-mixer IM2 distortion is reduced in accordance with equation (17) above.

The plot 600 comprises a vertical axis 606 that indicated a ratio of signal level to IM2 level, and therefore higher levels on the vertical axis 606 indicate greater reduction of systematic pre-mixer IM2 distortion. The plot 600 also comprises a differential axis 608 that illustrates levels of a differential pair bias voltage and associated offset (delta), and a cascode axis 610 that illustrates levels of a cascode pair bias voltage and associated offset (delta). The plot 600 also shows peaks and ridges that indicate the greatest IM2 reduction.

In an exemplary implementation, the bias voltages are set to achieve a desired level of IM2 reduction. For example, the differential and cascode bias voltages are set so that the resulting signal to IM2 ratio corresponds with a peak or ridge of the plot 600. Thus, for a given differential pair bias voltage level, a cascode bias voltage level can be determined that corresponds with a peak or ridge of the plot 600. Similarly, for a given cascode pair bias voltage level, a differential pair bias voltage level can be determined that corresponds with a peak or ridge of the plot 600. Thus, a selected level of IM2 reduction can be achieved by setting the differential and cascode bias signals to selected levels as indicated by the plot 600.

To illustrate how bias voltage levels can be determined from the plot 600 to obtain IM2 reduction that corresponds with a peak or ridge, a point 602 has been identified on a ridge of the plot 600. The signal to IM2 ratio associated with point 602 is achieve by maintaining the cascode bias voltage level (Vbias2 plus ΔVbias2) at 0 volts and setting the differential pair bias voltage level (Vbias1 plus ΔVbias1) to 0.02 volts. Another point 604 has been identified on a ridge of the plot 600. The signal to IM2 ratio associated with point 604 is achieved by maintaining the differential pair bias voltage level (Vbias1 plus ΔVbias1) at 0 volts and setting the cascode bias voltage level (Vbias2 plus ΔVbias2) to 0.066 volts. Thus, it is possible to set the differential and cascode bias voltage levels to achieve a desired signal to IM2 ratio illustrated on the plot 600.

Figure 7:
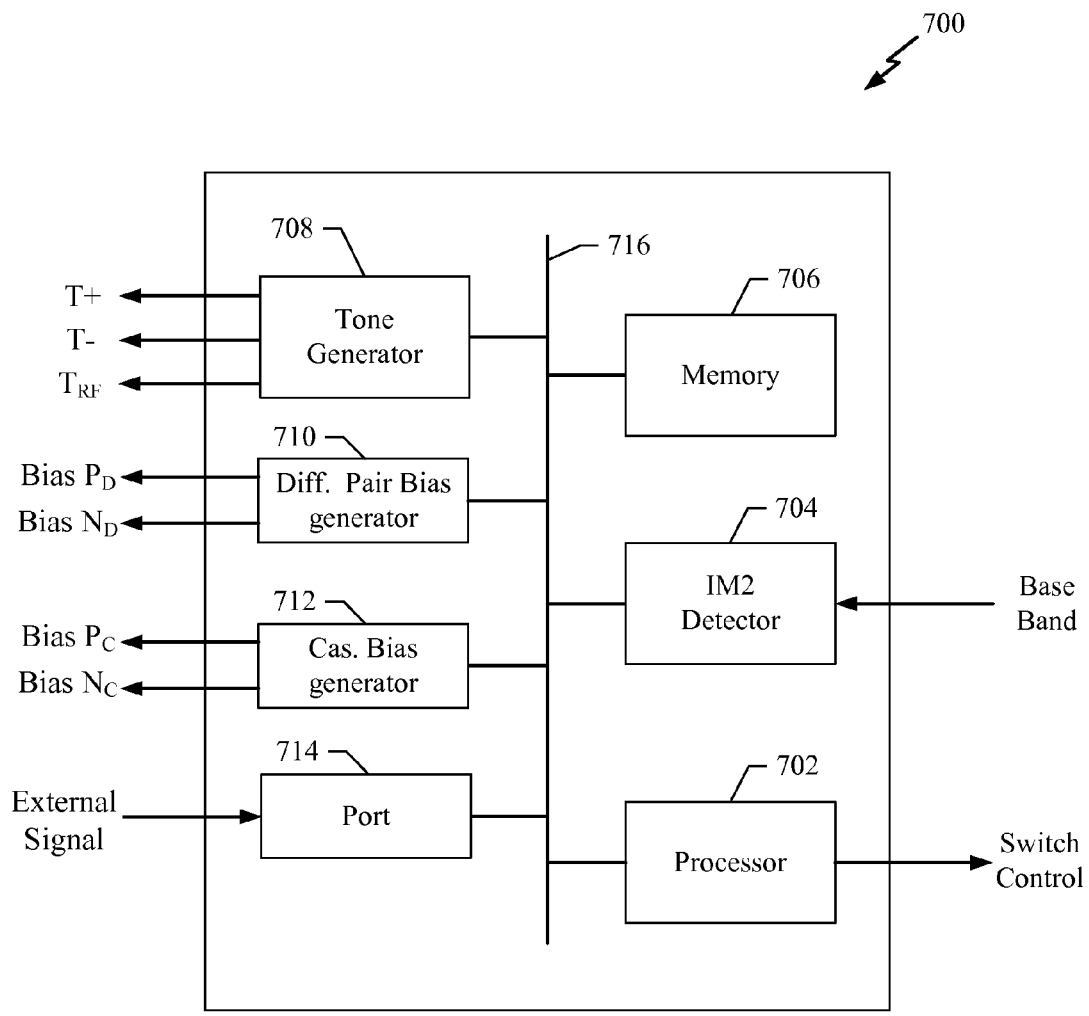
FIG. 7 shows an exemplary calibration module configured to set differential and cascode bias voltages to reduce systematic pre-mixer IM2 distortion associated with an LNA.

FIG. 7 shows an exemplary calibration module 700 configured to set differential and cascode bias voltages to reduce systematic pre-mixer IM2 distortion associated with an LNA. For example, the module 700 is suitable for use as the module 512 shown in FIG. 5. The module 700 comprises processor 702, IM2 detector 704, memory 706, tone generator 708, differential pair bias generator 710, cascode bias generator 712 and port 714, all coupled to communicate over bus 716.

The processor 702 comprises at least one of a CPU, processor, gate array, hardware logic, memory elements, and/or hardware executing software (not shown). The processor 702 operates to control the functions of the module 700 to reduce or eliminate systematic IM2 distortion as discussed below.

The IM2 detector 704 comprises at least one of a CPU, processor, gate array, hardware logic, memory elements, and/ or hardware executing software (not shown). The IM2 detector 704 operates to receive a baseband signal and perform an IM2 detection to detect systematic pre-mixer IM2 distortion. The detector 704 provides any desired detection algorithm or technique to detect the IM2 distortions. For example, the systematic pre-mixer IM2 distortion frequency is a summation of the two IM2 fundamental tone frequencies for a 2-tone test, or the $2^{nd}$ order harmonics frequency for a 1-tone test. This RF-IM2 frequency, (Frf-IM2) is down-converted to Baseband through a Local Oscillation Frequency (Flo), and then at the baseband output, the IM2 frequency is at Frf-IM2-Flo.

The memory 706 comprises RAM, ROM, EEPROM or any other type of memory device (not shown) that operates to allow information to be stored and retrieved. The memory 706 is operable to store information such as DAC settings, bias signal levels and/or any other parameters or information to facilitate IM2 detection and reduction. The memory 706 is also configured to store programs or instructions executable by the processor 702 to provide the functions described herein.

The tone generator 708 comprises at least one of a CPU, processor, gate array, hardware logic, memory elements, and/ or hardware executing software (not shown). The tone generator 708 is operable to generated one or more tones to be injected into the input of an LNA. For example, the tone generator 708 is operable to generate differential tones T+ and T−. The tone generator 708 is also operable to generate tone $T_{RF}$.

The bias generators 710-712 comprise at least one of a CPU, processor, gate array, hardware logic, memory elements, and/or hardware executing software (not shown). The bias generators 710-712 operate to generate bias signals that can be coupled to differential pair or cascode inputs of an LNA to facilitate reduction of systematic pre-mixer IM2 distortion.

The port 714 comprises any suitable hardware, logic, memory elements, and/or hardware executing software (not shown) configured to receive an external signal from an external signal generator. The received external signal is passed by the port 714 to the tone generator 708 where it is used to generate highly linear tones, such as the tones T+, T−, and $T_{RF}$.

First Calibration Mode

During operation in a first calibration mode, the processor 702 outputs the switch control signal to control the switches 522 and 524 to input the tones T+ and T− to the input of the LNA 508. The processor 702 also controls the tone generator 708 to generate the tones T+ and T−. The LNA 508 amplifies the tones and produces an amplified output that is input to the mixer 510. The amplified output includes systematic pre-mixer IM2 distortion associated with the LNA 508. The mixer 510 produces a BB signal 526 that is received by the IM2 detector 704.

The IM2 detector 704 processes the received BB signal 526 to determine the levels of systematic pre-mixer IM2 distortion. The level of distortion is provided to the processor 702. Based on these levels, the processor controls one or more of the bias generators 710-712 to output and/or adjust bias signals that are coupled to the inputs of the LNA 508. The bias signals operate to adjust the operation of the LNA to reduce systematic pre-mixer IM2 distortion. For example, the bias signals operate to adjust the output impedance of the LNA 508 until a desired optimized point is reached at which the IM2 distortion is reduced.

As the bias levels are adjusted, the base band signal received by the IM2 detector 704 changes accordingly. The IM2 detector 704 operates to detect any remaining IM2 distortion in the BB outputs and reports these amounts to the processor 702. Based on the amounts of IM2 distortion reported, the processor 702 again controls the bias generators 710-712 to adjust their bias signals. The algorithm to adjust the bias generators can be any related search algorithm such as sign-sign LMS or a simple binary search program. This process repeats until the level of systematic IM2 distortion is reduced, minimized, or eliminated. For example, the bias signals are adjusted until a desired suppression peak is reached, as illustrated in the graph 600 shown in FIG. 6. Data describing the bias signal levels output from the bias generators are stored in the memory 706 and can be access at the next power up or at any other time to restore the operation of the LNA to the optimized level of IM2 suppression previously determined.

Second Calibration Mode

During operation in a second calibration mode, the processor 702 outputs the switch control signal to control the switch 528 to input the tone $T_{RF}$ to the input of the SAW filter 504. The processor 702 also controls the tone generator 708 to generate the tone $T_{RF}$. The tone $T_{RF}$ flows through the SAW filter 504 and the matching network 506 and is input to the LNA 508. The LNA 508 amplifies the tone and produces an amplified output that is input to the mixer 510. The amplified output includes systematic pre-mixer IM2 distortion associated with the filter 504, network 506 and LNA 508. The mixer 510 produces a BB signal 526 that is received by the IM2 detector 704.

A calibration procedure similar to the first calibration procedure is performed to determine bias levels that operate to reduce systematic pre-mixer IM2 distortions. Unlike the first calibration procedure, the second calibration procedure accounts for front end components such as the SAW filter 504 and the matching network 506. Data associated with the determined bias levels are stored in the memory 706.

Operational Mode

During an operational mode, the bias generators 710-712 are temperature and/or process compensated modules that output precise bias signals that are stable over a wide temperature range. The processor 702 retrieves stored data describing the bias signal levels from the memory 706 and uses this data to control the bias generators 712-714 to output these precise bias levels. Thus, the LNA 508 is configured with pre-stored bias values that operate to reduce systematic pre-mixer IM2 distortions. These precise bias levels are generated by the temperature and/or process compensated bias generators 712-714 so the LNA 508 is able to operate over a large temperature range while reducing systematic premixer IM2 distortions.

It should also be noted that although the system is shown configured to reduce IM2 distortions associate with a differential LNA, the system can be configured and is equally suitable for use with single ended LNAs.

Figure 8:
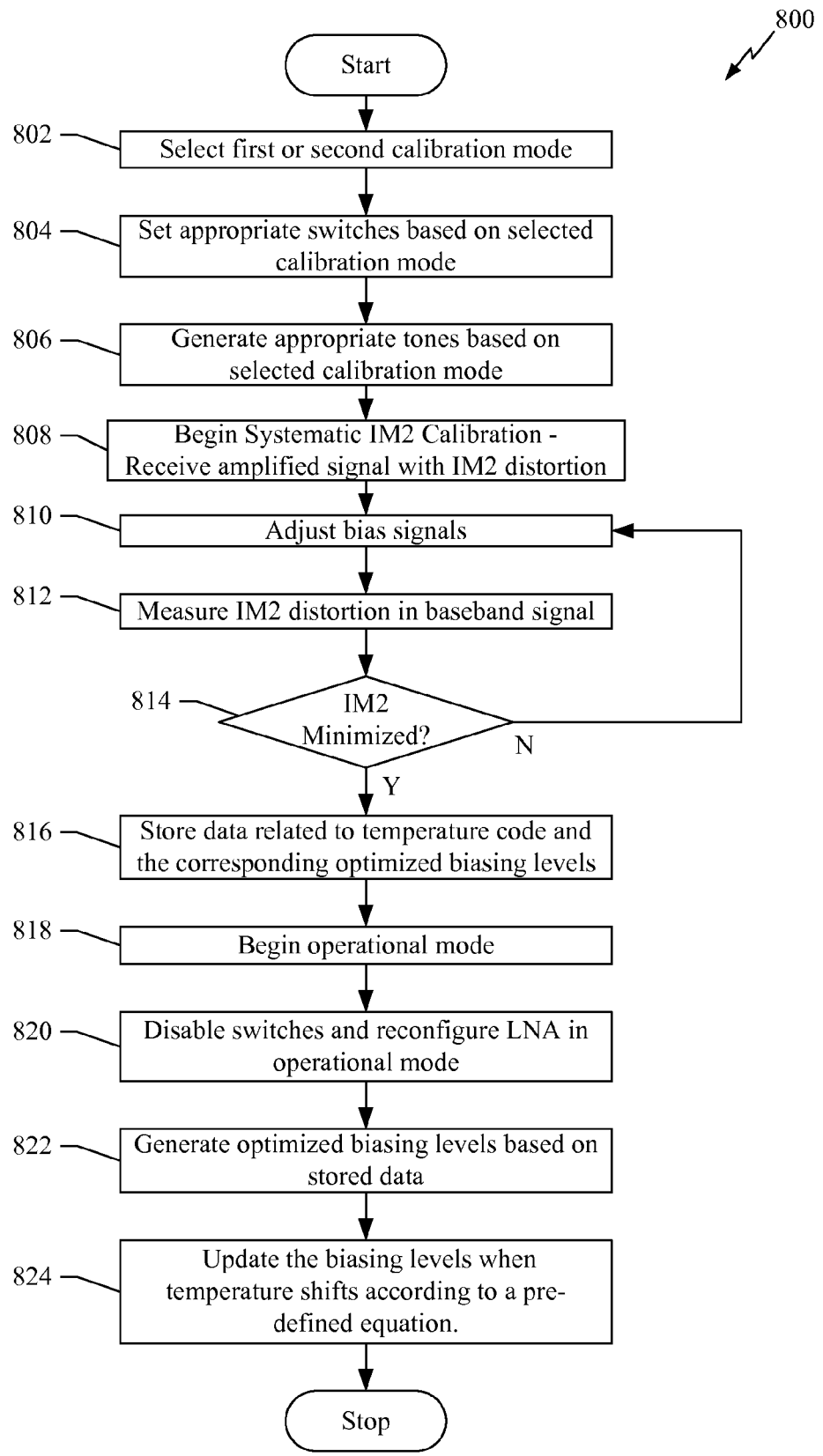
FIG. 8 shows an exemplary method for setting differential and cascode bias voltages to reduce systematic pre-mixer IM2 distortion associated with an LNA.

FIG. 8 shows an exemplary method 800 for setting differential and/or cascode bias voltages to reduce systematic pre-mixer IM2 distortion associated with an LNA. For example, the method 800 is described below with reference to the module 700 shown in FIG. 7.

At block 802, a calibration mode is selected. For example, the processor 702 selects a particular calibration mode and controls other functions elements at the module 700 to implement that mode. The calibration modes are described above.

At block 804, switches are set to the appropriate position based on the selected calibration mode. For example, in a first calibration mode, the processor 702 sets the switches 522 and 524 to couple one or more tones to the input of the LNA 508. In a second calibration mode, the processor 702 sets the switch 528 to couple the RF tone to the input of the SAW filter 504.

At block 806, tones are generated based on the selected calibration mode. In one implementation, the tone generator 708 generates the tones used in the calibration mode. In another implementation, the port 714 receives an external signal that is passed to the tone generator 708. The tone generator 708 uses the external signal to generate highly linear tones.

At block 808, systematic pre-mixer IM2 calibration begins. The selected calibration mode begins to determine the level of one or more bias signals that can be used to reduce systematic pre-mixer IM2 distortion determined during the selected calibration mode. For example, amplified LNA signals having a selected amount of IM2 distortion are received by the detector 704.

At block 810, bias signals are generated and/or adjusted. For example, the bias generators 710-712 output one or more bias signals that are coupled to the differential and/or cascode inputs of an LNA. The bias signals adjust the LNA to reduce systematic pre-mixer IM2 distortion.

At block 812, IM2 distortion is measured. For example, the IM2 detector 704 operates to measure systematic pre-mixer IM2 distortion included in a base band signal that is down converted from an amplified signal of the LNA.

At block 814, a determination is made as to whether IM2 distortion is reduced to a desired level. For example, the processor 702 determines if the level of IM2 distortion is reduced to the desired level by tracking the level of IM2 distortion detected as the bias signal levels are adjusted. In one implementation, the processor 702 operates to determine the bias signal level that yields the lowest IM2 distortion. In another implementation, the processor 702 operates to determine the bias signal level that yields a selected level of IM2 distortion reduction. If the desired level of IM2 distortion reduction is reached, the method 800 proceeds to block 816. If the desired level of IM2 distortion reduction is not reached the method 800 proceeds to block 810.

At block 816, data related to the temperature codes and bias signal levels are stored. In one implementation, temperature codes along with the bias signal levels that produce the desired level of IM2 distortion reduction are both stored in the memory 706. And in one implementation, the processor 702 pre-calculates the corresponding optimized bias signal levels according to a pre-defined formula over other operating temperatures.

At block 818, operational mode begins. In operational mode, the processor 702 reconfigures the switches to allow normal processing of received RF signals by the LNA 508.

At block 820, switches are disabled and LNA configured in operational mode. For example, the processor 702 outputs the switch control signal to control the switches so that an RF input signal is coupled to front end components and the output of the front end components is coupled to the input of the LNA.

At block 822, optimized bias signal levels are generated based on the stored data. For example, the processor 702 retrieves the data from the memory 706 that indicate the temperature codes and level of bias signals used to obtain the desired amount of systematic pre-mixer IM2 distortion reduction and uses these parameters to set the level of bias signals output from the bias generators 710-712.

At block 824, bias signal levels are updated based on temperature changes according to block 816. In one implementation, the bias generators 710-712 are temperature and/or process compensated bias generators so that the bias signals they output are also temperature and/or process compensated. Combined with block 816 and block 824, when temperature changes, the bias signals are compensated accordingly so as to reduce variation of the optimized result over process and temperature. The processor 702 may assist in this compensation process. The LNA then operates with reduced IM2 distortion over a wide temperature range.

Thus, the method 800 operates to set differential and cascode bias voltages to reduce systematic IM2 distortion associated with an LNA. It should be noted that the method 800 is just one implementation and that the operations of the method 800 may be rearranged or otherwise modified such that other implementations are possible.

Figure 9:
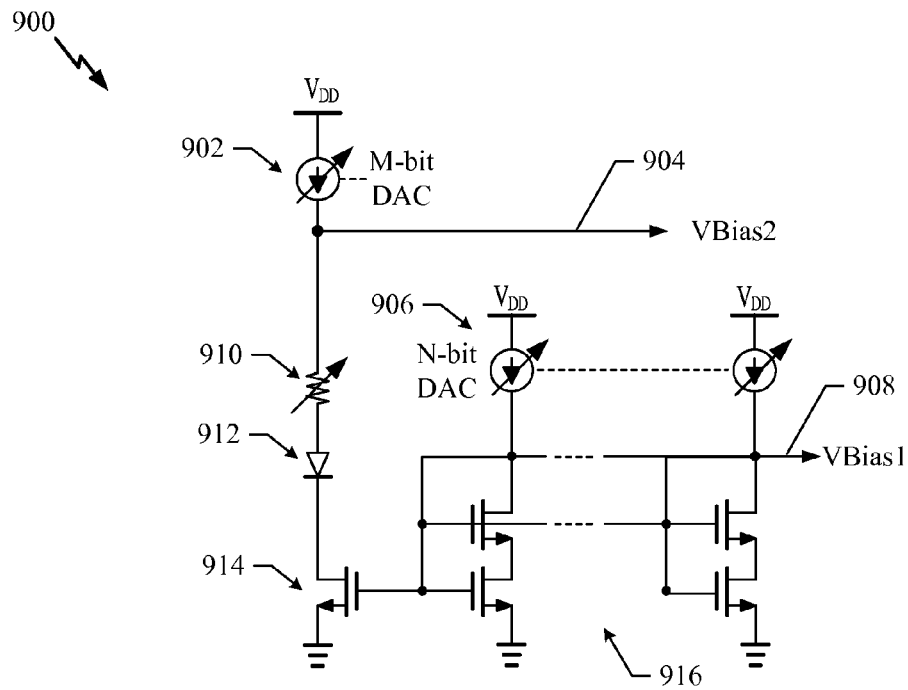
FIG. 9 shows a temperature and process compensated bias signal generator to generate differential and cascode bias voltages to reduce systematic pre-mixer IM2 distortion associated with an LNA.

FIG. 9 shows an exemplary temperature and/or process compensated bias signal generator 900 configured to set differential and cascode bias voltage levels to reduce systematic pre-mixer IM2 distortion associated with an LNA. For example, the temperature compensated bias voltage generator 900 is suitable for use as the bias generators 710-712 shown in FIG. 7.

The bias generator 900 comprises a first temperature compensated (M-bit) DAC current source 902 (or current DAC) that provides current from a supply ($V_{DD}$) to a variable resistor 910, diode 912 and transistor 914 to generate a VBias2 signal 904. One or more additional temperature compensated (N-bit) DAC current sources 906 are coupled to a corresponding transistor circuit 916 to produce a VBias1 signal 908. During operation, the processor 702 loads digital values into the DAC current sources 902 and 906 so that precise temperature compensated bias voltage levels are generated. For example, in one implementation, the processor 702 maintains one or more DAC code tables in the memory 706. The DAC code tables comprise DAC codes associated with one or more temperature values. Based on the current temperature, the processor retrieves the appropriate DAC codes from the stored tables and loads the DAC current sources 902 and 906 with the appropriate codes. The circuitry then provides precise bias voltage levels over a range of temperatures. If the temperature changes by a significant amount, the processor 702 retrieves new DAC codes associated with the new temperature and loads these codes into the DAC current sources 902 and 906. Thus, the processor 702 operates to control the bias generator 900 to generate precise temperature and process compensated bias signals.

It should be noted that the bias generators 710-712 are not limited to the implementations shown in FIG. 9 and that any other suitable type of temperature and process compensated bias generator may be used.

Figure 10:
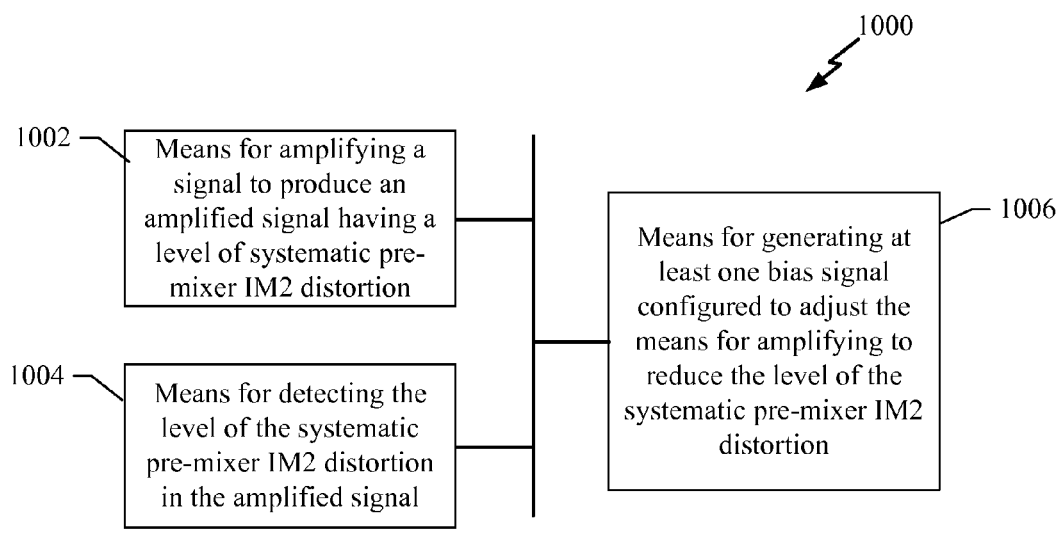
FIG. 10 shows an exemplary apparatus configured to reduce systematic pre-mixer IM2 distortion associated with an LNA.

FIG. 10 shows an exemplary apparatus 1000 configured to reduce systematic pre-mixer IM2 distortion associated with an LNA. The apparatus 1000 is suitable for use with the amplifier 500 shown in FIG. 5. In an aspect, the apparatus 1000 is implemented by one or more modules configured to provide the functions as described herein. For example, in an aspect, each module comprises hardware and/or hardware executing software.

The apparatus 1000 comprises a first module comprising means (1002) for amplifying a signal to produce an amplified signal having a level of systematic pre-mixer IM2 distortion, which in an aspect comprises the LNA 508.

The apparatus 1000 also comprises a second module comprising means (1004) for detecting the level of the systematic pre-mixer IM2 distortion in the amplified signal, which in an aspect comprises the detection module 514.

The apparatus 1000 also comprises a third module comprising means (1006) for generating at least one bias signal configured to adjust the means for amplifying to reduce the level of the systematic pre-mixer IM2 distortion, which in an aspect comprise the bias generators 516 and 518.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    an amplifier having a differential transistor pair and a cascode transistor pair, the amplifier configured to output an amplified signal having a level of systematic pre-mixer IM2 distortion;
    a detector configured to detect the level of the systematic pre-mixer IM2 distortion in the amplified signal; and
    a bias signal generator configured to generate first bias signals connected to the differential transistor pair and second bias signals connected to the cascode transistor pair, the first and second bias signals configured to adjust the amplifier to reduce the level of the systematic pre-mixer IM2 distortion.

2. The apparatus of claim 1, the first and second bias signals configured to gate bias the amplifier to reduce the level of the systematic pre-mixer IM2 distortion.

3. The apparatus of claim 1, the first and second bias signals configured to adjust an output impedance parameter of the amplifier to reduce the level of the systematic pre-mixer IM2 distortion that is detected by the detector.

4. The apparatus of claim 3, the output impedance parameter comprising a first derivative of an output impedance with respect to an output voltage at a selected amplifier operating point.

5. The apparatus of claim 1, the first bias signals comprising differential pair bias signals and the second bias signals comprising cascode pair bias signals.

6. The apparatus of claim 5, the first and second bias signals configured so that the differential pair bias signals are set to a selected level and the cascode pair bias signals are set to system ground level.

7. The apparatus of claim 5, the first and second bias signals configured so that the differential pair bias signals are set to a system ground level and the cascode pair bias signals are set to a selected level.

8. The apparatus of claim 5, the first and second bias signals configured so that the differential pair bias signals are set to a first selected level and the cascode pair bias signals are set to a second selected level.

9. The apparatus of claim 1, the amplifier comprises a low noise amplifier.

10. The apparatus of claim 1, the bias signal generator configured to output the first and second bias signals to have at least one of temperature and process compensation.

11. The apparatus of claim 1, further comprising a memory configured to store data associated with pre-determined bias signal levels that are used by the bias signal generator to generate the first and second bias signals.

12. The apparatus of claim 1, further comprising a tone generator configured to output at least one tone that is coupled to the amplifier to perform a calibration to determine levels for the first and second bias signals.

13. The apparatus of claim 12, further comprising a port configured to receive the at least one tone from an external signal generator.

14. An apparatus comprising:
means for detecting a level of systematic pre-mixer IM2 distortion in an amplified signal that is output from an amplifier having a differential transistor pair and a cascode transistor pair; and
means for generating first bias signals connected to the differential transistor pair and second bias signals connected to the cascode transistor pair, the first and second bias signals configured to reduce the level of the systematic pre-mixer IM2 distortion.

15. The apparatus of claim 14, the means for generating further comprising means for adjusting an output impedance parameter associated with the amplifier to adjust the level of the systematic pre-mixer IM2 distortion that is detected by the means for detecting.

16. The apparatus of claim 15, the output impedance parameter is a first derivative of the output impedance with respect to an output voltage at a selected operating point.

17. A method comprising:
receiving an amplified signal from an amplifier having a differential transistor pair and a cascode transistor pair, said amplified signal having a level of systematic pre-mixer IM2 distortion;
detecting the level of the systematic pre-mixer IM2 distortion in the amplified signal; and
generating first bias signals connected to the differential transistor pair and second bias signals connected to the cascode transistor pair, the first and second bias signals configured to reduce the level of the systematic pre-mixer IM2 distortion.

18. The method of claim 17, the first and second bias signals configured to adjust an output impedance parameter of the amplifier to reduce the level of the systematic pre-mixer IM2 distortion.

19. The method of claim 18, the output impedance parameter is a first derivative of the output impedance with respect to an output voltage at a selected operating point.

20. The method of claim 17, the amplifier comprises a low noise amplifier.

* * * * *